United States Patent [19]
Kornblum et al.

[11] Patent Number: 5,598,157
[45] Date of Patent: Jan. 28, 1997

[54] SIGMA DELTA ANALOG TO DIGITAL CONVERTER WITH THREE POINT CALIBRATION APPARATUS AND METHOD

[75] Inventors: John J. Kornblum, Indialantic; Carlos A. Ugarte, Palm Bay, both of Fla.; Fan Y. Ma, Girang, Singapore

[73] Assignee: Harris Corporation, Melbourne, Fla.

[21] Appl. No.: 331,015

[22] Filed: Oct. 28, 1994

[51] Int. Cl.⁶ .................................................... H03M 1/10
[52] U.S. Cl. .................................................. 341/120; 341/143
[58] Field of Search .................................... 341/118, 120, 341/143

[56] References Cited

U.S. PATENT DOCUMENTS

| | | | |
|---|---|---|---|
| 4,143,361 | 3/1979 | Tammes et al. | 341/118 |
| 4,280,196 | 7/1981 | Hornak et al. | 365/45 |
| 4,799,041 | 1/1989 | Layton | 341/120 |
| 4,894,656 | 1/1990 | Hwang et al. | 341/120 |
| 4,918,454 | 4/1990 | Early et al. | 341/172 |
| 4,943,807 | 7/1990 | Early et al. | 341/120 |
| 4,947,168 | 8/1990 | Myers | 341/120 |
| 5,087,914 | 2/1992 | Sooch et al. | 341/120 |
| 5,121,119 | 6/1992 | Higuchi et al. | 341/120 |
| 5,172,115 | 12/1992 | Kerth et al. | 341/118 |
| 5,206,602 | 4/1993 | Baumgartner et al. | 330/9 |
| 5,248,970 | 9/1993 | Sooch et al. | 341/120 |
| 5,257,026 | 10/1993 | Thompson et al. | 341/118 |
| 5,266,952 | 11/1993 | Stone et al. | 341/156 |
| 5,293,169 | 3/1994 | Baumgartner et al. | 341/172 |
| 5,305,004 | 4/1994 | Fattaruso | 341/120 |
| 5,329,281 | 7/1994 | Baumgartner et al. | 341/139 |
| 5,337,230 | 8/1994 | Baumgartner et al. | 364/138 |
| 5,465,092 | 11/1995 | Mayes et al. | 341/118 |

*Primary Examiner*—Marc S. Hoff
*Attorney, Agent, or Firm*—Nixon, Hargrave, Devans & Doyle

[57] ABSTRACT

An analog to digital converter 10 has a switched capacitor analog modulator 12 with three point calibration. Offset calibration applies on offset correction value in OCR 22 to an uncalibrated digital output. Register 28 holds a desired full scale value, register 24 holds a positive full scale value, and register 26 holds a negative full scale value. Depending upon the polarity of the converted analog signal, the offset corrected digital signal is multiplied by a positive or a negative gain correction factor.

11 Claims, 3 Drawing Sheets

SIGMA DELTA ANALOG TO DIGITAL CONVERTER WITH THREE POINT CALIBRATION APPARATUS AND METHOD

BACKGROUND

This invention relates to Sigma Delta analog to digital converters (ADC), and, in particular, to an apparatus and a method for improving the integral non-linearity of Sigma-Delta ADCs through three point digital calibration.

Some ADCs make provision for correcting inherent errors. Such correction is commonly known as calibration which corrects for offset and gain errors. Offset is demonstrated by the ADC having a non-zero output when its input signal is zero or ground. In prior art devices the zero input is converted into a digital value, stored and subtracted from all other digital values converted thereafter. Gain error is demonstrated by the ADC having a non-ideal output, i.e., different from all 1s, when the full scale input signal is applied and offset error has been removed. In a similar manner prior art devices convert a positive reference voltage into a digital value that is offset corrected, and used to generate a gain correction factor. This gain correction factor is multiplied by all other offset corrected digital values converted thereafter.

Calibration relies upon the basic formula for a slope of a line, i.e. y=mx+b, where m represents the gain correction factor and b is the offset correction value. The ideal output for an ADC is all 1s when the input is at its full scale value. However, the actual noncalibrated full scale output of the ADC may be more or less, so its uncalibrated output is different from all 1s. In other words, instead of a slope of m, the slope is 0.5 m or 1.3 m or some other value different from the ideal. To remove gain error of the ADC others multiplied the offset calibrated output of the ADC by a gain correction factor that is the quotient of a division where the numerator represents the total resolution of the converter and the denominator is the offset corrected digital code determined from a full scale input to the ADC. As such, when an input analog signal corresponding to the actual full scale output is converted and multiplied by the calibration correction factor, the result will be the maximum output, i.e. all 1s. For example, in a three bit ADC the desired full scale output would be 111. Suppose the three bit ADC is designed to convert a full scale input of 2 volts to a digital signal. A fill scale input of 2 volts should yield a digital output of 111. Each binary code in the digital output represents one-eight of the span or ¼ volts (i.e. LSB=0.25 V). However, one finds that when a input signal of 2 volts is applied, the offset corrected output is not 111 but rather 110. So, the three bit ADC has a gain calibration factor of 111/110, i.e. a correction factor of ⅞. So, any applied voltage signal will be corrected by subtracting offset and multiplying the correction factor (111/110) against the offset corrected value.

There are existing techniques for digital calibration to minimize offset and gain errors in Sigma Delta converters. See, for example, U.S. Pat. Nos. 4,943,807, 5,305,004 for examples of digital offset correction and unipolar gain slope correction.

The Sigma Delta modulator is the critical component in determining accuracy and linearity. In a Sigma Delta modulator with a switched capacitor integrator front-end the principal sources of non-linearity have been identified as the voltage coefficient of the capacitors (1st and 2nd order, primarily) as well as integrator leakage. Integrator leakage is due to finite integrator DC gain. This can be overcome by designing an integrator with sufficient gain for a particular application. Nonlinearity due to capacitor voltage coefficient can be addressed, to a certain extent, with a fully differential modulator structure. The fully differential signal paths allow the cancellation of first order nonlinearity due to the first order capacitor coefficient. However, the second order voltage coefficient will generate nonlinearities since they are not cancelled by these signal paths.

It has been observed that an ADC with a Sigma Delta modulator exhibits different gains for input signals of different polarities. So, negative signals will have a gain different from positive signals. It is believed that the observed difference in gains results from second order effects including the negative capacitance coefficients in the Taylor series expansion for the combined capacitance of a Sigma Delta modulator. See, for example, U.S. Pat. No. 4,918,454. Distortion due to 2nd order voltage coefficient effects are compensated for by using a capacitor interconnection scheme as shown in U.S. Pat. No. 4,918,454. There are shown polycrystalline silicon capacitors configured such that the lower plate of one capacitor is connected to the upper plate of the other capacitor and the lower plate of the other capacitor is connected to the upper plate of the first capacitor. With such a configuration, the odd ordered nonlinearity contributing to the voltage coefficient errors are cancelled.

It would be desireable to have a solution to the problem of nonlinearities in ADCs without resort to a modification of the capacitor interconnection system. It would also be desireable to have a digital circuit solution to the problem of different gains of input voltages of different polarities. As is also desireable to have a piecewise linear transfer function for the ADS.

SUMMARY

The invention provides an ADC with a Sigma Delta modulator, with n bit resolution and with three point calibration of a digitally filtered output of a bipolar analog signal. The three points of calibration include offset at the bipolar midscale point, positive full scale and negative full scale. The analog modulator has its output applied to a digital filter. The output of the digital filter is calibrated to correct for offset and for bipolar gain variations. The analog modulator has input reference signals corresponding to ground or zero, a positive reference signal and a negative reference signal. In an offset calibration operation, the ground reference signal is coupled to the input of the analog modulator to generate a digital offset correction signal. The digital offset correction signal is stored in an offset correction register. The value of the offset correction may be positive or negative. The value of the offset correction register is subtracted from the digital filter output for each conversion.

The ADC has separate gain correction factors for positive and negative inputs. In a positive gain calibration, operation, the positive reference signal is coupled to the input of the analog modulator to generate an uncalibrated positive full scale digital output signal. The offset correction is applied to the uncalibrated output signal to provide a positive full scale digital output signal. The positive full scale digital output signal is stored in a positive full scale register. The positive gain correction factor is provided by dividing half of the resolution of the desired full scale output of the ADC by the contents stored in the positive full scale register. Since there are separate corrections for positive and negative signals, half the resolution is used to correct for signals of one polarity and the other half of the resolution is used to correct for signals of the opposite polarity. The positive gain correction factor is stored in its own register while needed.

The negative input correction factor is formed in a similar manner. In a negative gain calibration operation, the negative reference signal is coupled to the input of the analog modulator to generate an uncalibrated negative full scale digital output signal. The offset correction is applied to the uncalibrated negative full scale digital output signal to provide a negative full scale digital output signal. The negative full scale digital output signal is stored in a negative full scale register. The negative gain correction factor is provided by dividing half of the resolution of the desired full scale register by the contents stored in the negative full scale register. The negative gain correction factor is stored only while it is needed.

In operation, an input analog signal is applied to the analog modulator. The output of the modulator is coupled to the digital filter and the digital filter provides an uncorrected digital signal to a summing node. The digital filter output is a digital signal representative of the applied analog voltage. A summing node applies the offset correction signal stored in the offset correction register to the uncorrected digital signal. Depending upon the polarity of the offset corrected digital signal, the latter is multiplied by the positive or negative gain correction factor to yield a calibrated, corrected digital output signal. It is also possible to perform the gain correction directly on the offset corrected signal. As such, the offset corrected signal may be multiplied by half the full scale resolution of the ADC and divided by the signal in the positive or negative full scale register. The invention also relies upon a 2's compliment coding so the most significant bit indicates the polarity of the offset corrected digital signal.

It is another feature of the invention to provide an inversion capability of the inputs to the analog modulator. The analog modulator has a differential input with positive and negative terminals. The invention couples a positive reference voltage to the negative differential input and couples a zero or ground voltage to the positive differential input to emulate a negative reference signal. So, the invention eliminates the need for separate reference signals by allowing both positive and negative gain correction factors to be generated from the positive reference signal.

Having summarized the invention, those skilled in the art are referred to the attached drawing and the following detailed description for a further understanding of the invention.

DRAWING

DETAILED DESCRIPTION

Figure 1:
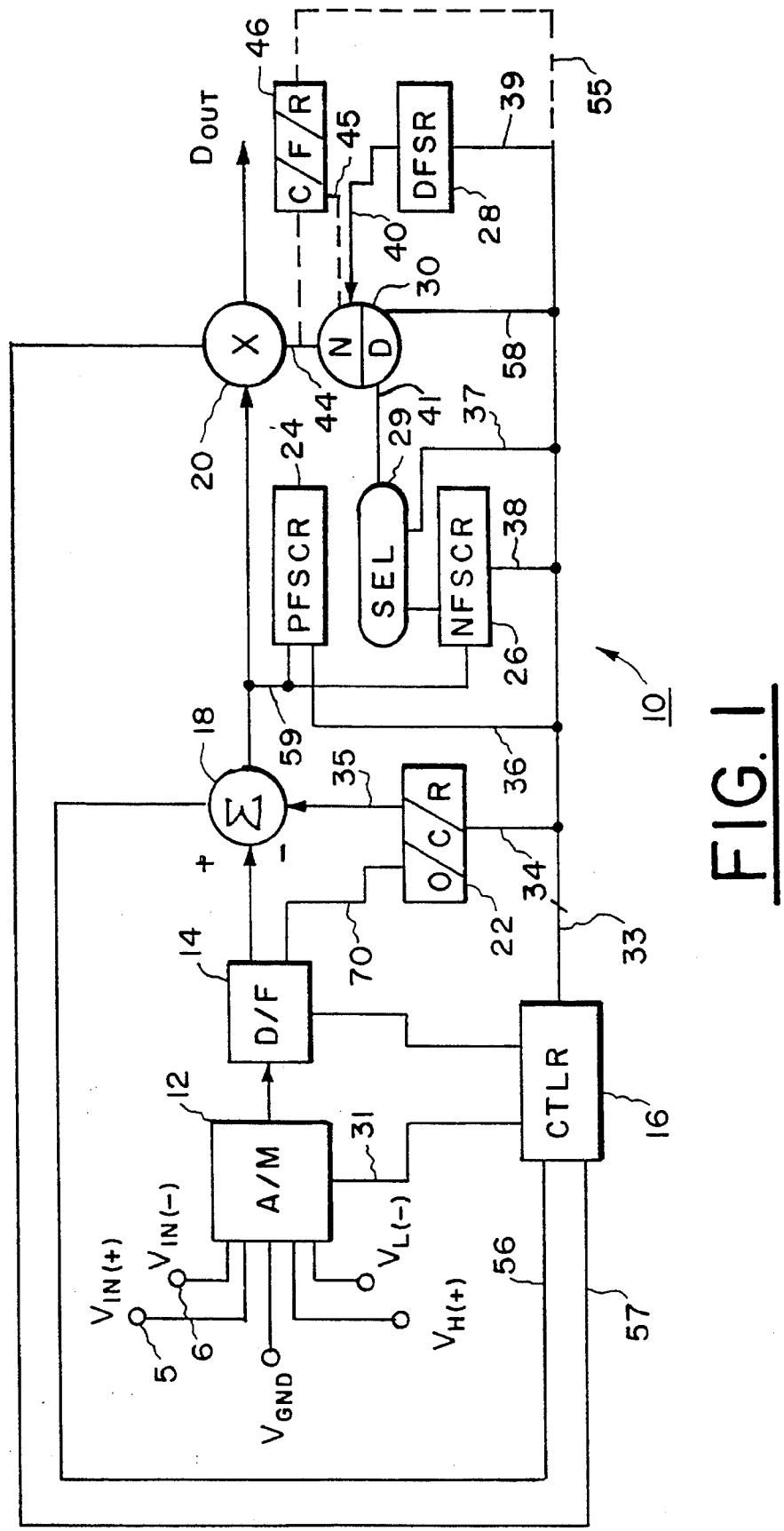
FIG. 1 is a schematic representation of a SIGMA DELTA ADC with functional blocks for performing three point calibration.

With reference to FIG. 1 there is shown an ADC 10 with a switched capacitor analog modulator 12. In actual design implementation, the analog modulator inputs are fully differential. The input voltage $V_{IN}$ is coupled to differential input terminals 5, 6. For the purposes of this description, three additional voltage signals are shown as inputs to the analog modulator 12. These inputs, $V_{H(+)}$, $V_{L(-)}$, and $V_{GND}$ are shown for clarity of discussion only and are not actual inputs to the modulator.

The signal $V_{H(+)}$ is a positive full scale reference voltage signal that in actual design practice can be generated by placing the most positive voltage the ADC can convert on terminal 5 ($V_{IN+}$) and grounding terminal 6 ($V_{IN-}$). The signal $V_{L(-)}$ is a negative full scale reference voltage signal that in actual design practice can be generated by placing the most negative voltage the ADC can convert on terminal 6 ($V_{IN-}$) and grounding terminal 5 ($V_{IN+}$). The signal $V_{GND}$ is a zero scale reference voltage signal that in actual design practice can be generated by shorting terminal 5 ($V_{IN+}$) to terminal 6 ($V_{IN-}$).

Those skilled in the art can see that many different methods can be used to implement the three reference voltages. For example, suitable circuitry could supply a negative full scale reference voltage by placing a positive reference voltage on the input terminal 6 ($V_{IN-}$) and grounding the other input terminal 5 ($V_{IN+}$).

The output of the analog modulator 12 is a converted digital signal that is coupled to a digital filter 14. The output of the digital filter 14 is coupled to a summing node 18. At the summing node 18, the output of the digital filter 14 is corrected for offset. The offset corrected digital signal is input to a multiplier 20. In the multiplier 20 the offset corrected digital signal is gained corrected to provide the digital output signal $D_{OUT}$.

Controller 16 controls the operation of the ADC 10 and, in particular, the switched capacitor analog modulator 12, digital filter 14, the summing node 18, multiplier 20, and divider 30. The controller 16 has control lines 31–46, 55–58 for carrying control signals to the components of the ADC 10. Accordingly, the controller 16 controls division operations and multiplication operations on digital signals to generate gain correction factors for positive and negative input signals when the ADC 10 operates in its bipolar mode and another gain correction factor for unipolar mode. Offset correction register (OCR) 22 stores a digital signal representative of the offset error of the ADC 10. OCR 22 receives the output of the filter 14 via data line 70 when $V_{IN}$ is set to $V_{GND}$. That offset error is subtracted from the output of the digital filter 14 at the summing node 18 to provide an offset corrected digital signal to the multiplier 20. Controller 16 is also coupled to a positive full scale correction register (PFSCR) 24 and a negative full scale correction register (NFSCR) 26, and to a desired full scale register 28. The desired full scale register (DFSR) 28 holds a digital value corresponding to half the resolution of the ADC 10. In operation, the DFSR 28 is a single bit register. Since the value of DFSR 28 always the maximum digital signal output code, the DFSR 28 can be one bit which is continuously set to a predetermined value for each adding and subtracting operation as will be further explained hereinafter. The DFRSR 28 contains a digital signal representing one half of the resolution of the converter 10 for bipolar operation and representing the full resolution of the converter 10 for unipolar operation.

Data path line 59 carries the offset corrected full scale signal from the output of summing node 18 for storage in the appropriate register 24, 26. The positive full scale correction register 24 holds a digital signal corresponding to the voltage appearing at the output of the summing node 18 after the reference voltage $V_{H(+)}$ is applied to the analog modulator 12. The negative full scale register (NFSCR) 26 holds a digital signal corresponding to the output of summing node 18 when the negative reference voltage $V_{L(-)}$ is applied to the analog modulator 12 and converted to a digital signal. The controller 16 is coupled via control line 33 and line 37 to a selector 29. The selector 29 applies the value of the PFSCR 24 or the NFSCR 26 to the denominator of a divider 30. The numerator of the divider 30 receives the output the DFSR 28. As such, the value in the divider 30 corresponds to the correction value for the gain of the ADC 10. This correction value may be stored in a correction factor register 46. The correction factor register 46 is also controlled by controller 16 via control line 55.

The analog modulator 12 is a typical Sigma Delta modulator well known to those skilled in the art. Analog modulator 12 performs a one bit A to D conversion. The analog modulator 12 uses a switch capacitor charge balancing circuit for performing sequential one bit conversions of the input signal $V_{IN}$. In operation the input signal $V_{IN}$ is switched across an integrating amplifier. The integrating amplifier outputs a ramp type function since it sees a step type input. When the ramp function output of the integrator reaches a predetermined value of one bit, the digital value is applied to a summing node that subtracts the equivalent voltage corresponding to one bit from the input signal $V_{IN}$. As such, the analog modulator 12 provides a series of digital output values (1 or 0) that are input to a digital low pass filter 14. The filter 14 is coupled to a timer (not shown) that is run by a clock (not shown) provided by the controller 16. The combination of the timer and the low pass filter 14 are used to provide an output representative of the average number of ones in the input signal $V_{IN}$. The higher number of ones, the larger the signal; the smaller the number of ones, the lower the signal. Accordingly, the analog modulator 12 converts small voltage variations one bit at a time, and is fast and accurate. The digital filter 14 removes out-of-band quantization noise, sample rate reduction and interference from 50/60 Hz noise.

Figure 2:
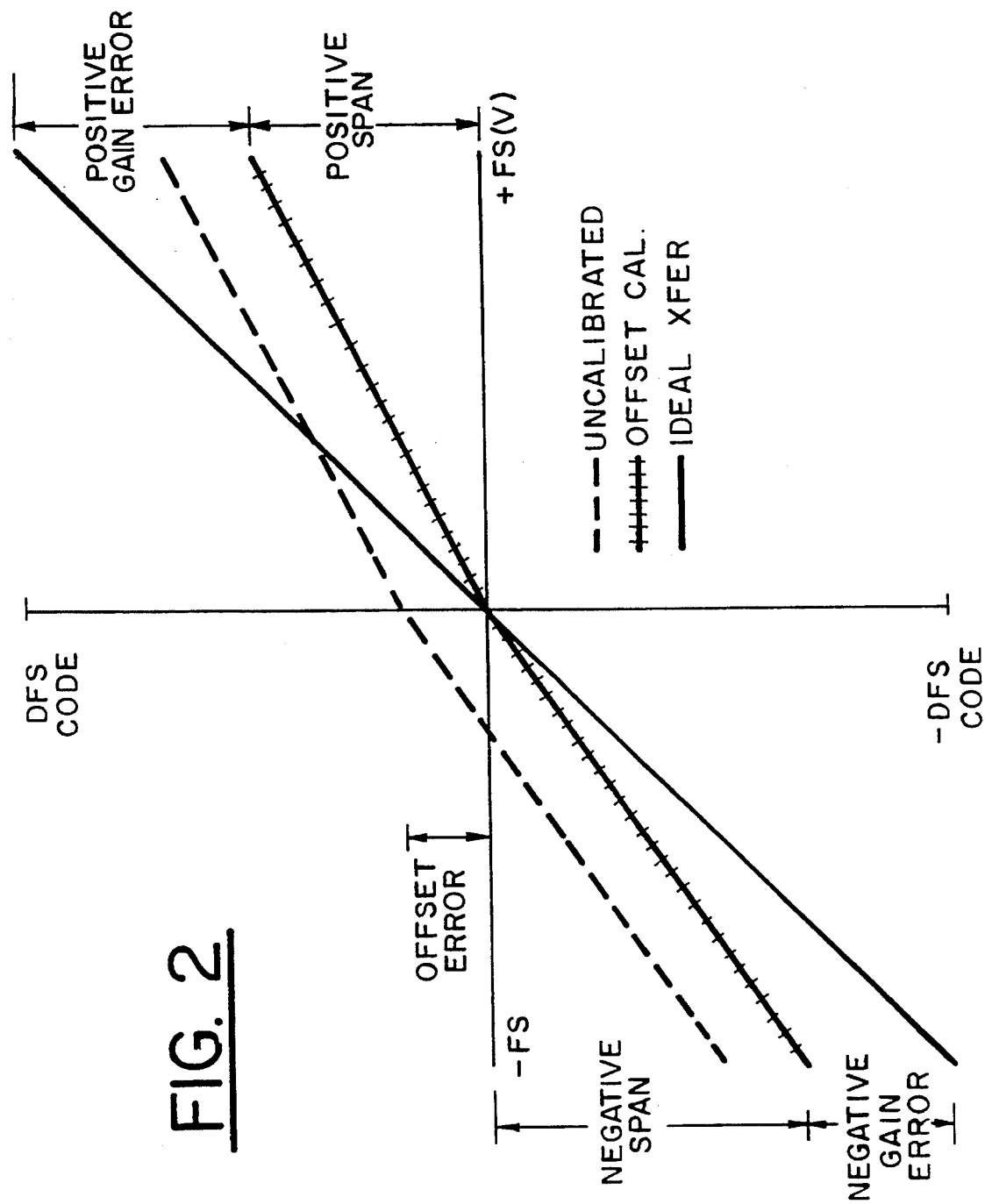
FIG. 2 is a graph showing offset and gain correction.

With reference to FIG. 2, there is shown a first curve A. Curve A is the uncalibrated digital representation of the applied input voltage, $V_{IN}$. Curve B is the offset corrected digital representation of the applied input voltage, $V_{IN}$. Curve B has one slope for positive voltages and a different slope for negative voltages. Curve C represents the ideal transfer function of the ADC. The difference between curve B and curve C is due to gain nonidealities in the analog modulator and digital filter. As seen, there is a positive offset when the input voltage, $V_{IN}$, is zero and the slope of the uncalibrated data is different for negative versus positive voltages.

In an offset calibration operation, the zero or ground reference signal is coupled to the input of the analog modulator 12. The uncalibrated digital output of filter 14 is stored in the OCR 22 and is subtracted from the uncalibrated digital representation of all conversions thereafter. This is represented by curve B of FIG. 2.

Gain correction requires the offset corrected digital representation be multiplied by a gain slope factor. Two gain slope factors are generated, one for positive voltages (after offset correction), the other for negative voltages (after offset correction).

In a positive gain calibration operation, the positive reference signal $V_{H(+)}$ is coupled to the input of the analog modulator to generate an uncalibrated positive full scale digital output signal. The offset correction in OCR 22 is applied to the uncalibrated positive full scale digital output signal to provide a positive full scale digital output signal. The positive full scale digital output signal is stored in PFSCR 24.

In a negative gain calibration operation, the negative reference signal $V_{L(-)}$ is coupled to the input of the analog modulator 12 to generate an uncalibrated negative full scale digital output signal. The offset correction in OCR 22 is applied to the uncalibrated negative full scale digital output signal to provide a negative full scale digital output signal. The negative full scale digital output signal is stored in a NFSCR 26.

To change the gain characteristics from that of curve B to curve C, the offset calibrated digital signal is inspected for polarity and multiplied by the proper gain slope factor. If the polarity of the offset corrected data indicates a positive voltage is being converted, the positive gain slope factor is generated by dividing the contents of the DFSR 28 value by the PFSCR 24 value and multiplying that quotient by the offset corrected digital signal. If the polarity indicates a negative voltage is being converted, the negative gain slope factor is generated by dividing the contents of the DFSR 28 value by the NFSCR 26 value and multiplying that quotient by the offset corrected digital signal.

In summary, for a complete calibration to occur, the ADC 10 records the filter 14 output under three different input conditions. A zero scale input, $V_{GND}$ is used to eliminate offset error, a positive full scale input $V_{H(+)}$ is used to eliminate gain error for positive input voltages and a negative full scale input $V_{L(-)}$ is used to eliminate gain error for negative input voltages. The ADC 10 automatically selects the proper gain slope factor depending on the offset corrected data. If the offset corrected data is positive, representing a positive voltage, the positive gain slope factor is used. If the offset corrected data is negative, representing a negative voltage, the negative gain slope factor is used.

Figure 3:
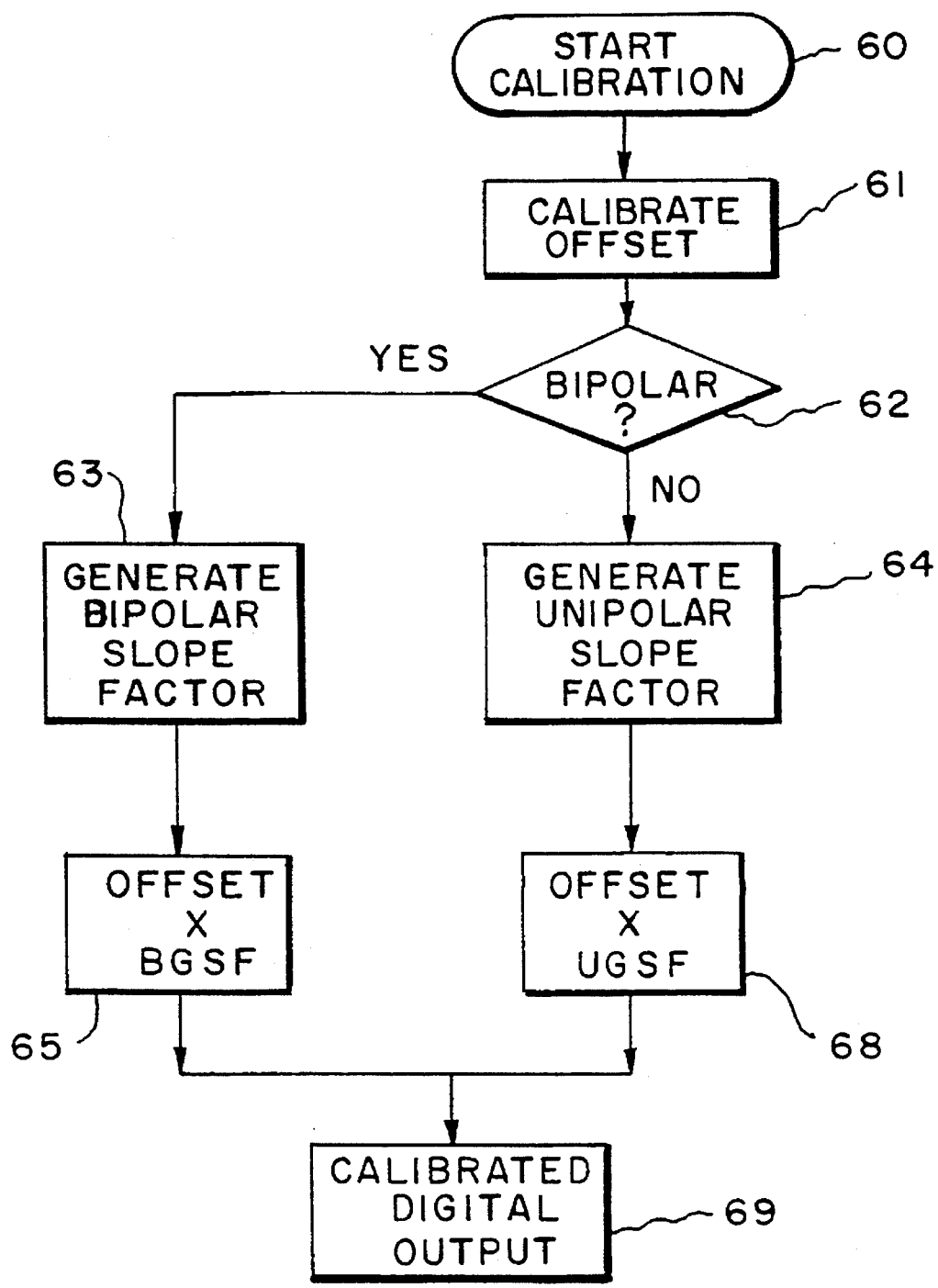
FIG. 3 is a flow chart diagram indicating the calibration steps performed by the apparatus of FIG. 1.

With reference to FIG. 3, the steps required for calibrating the output of the digital filter begin with a start calibration step 60. The following step 61 removes offset error. Next the process determines in step 62 whether the ADC 10 is set up for bipolar or unipolar operation. If bipolar operation is active, then in step 63, the polarity of the offset corrected digital signal is determined. In step 63, if the polarity of the offset corrected data indicates a positive voltage is being converted, the positive gain slope factor is generated by dividing the contents of the desired full scale register value by the positive full scale register value. In step 63, if the polarity indicates a negative voltage is being converted, the negative gain slope factor is generated by dividing the contents of the desired full scale register value by the negative full scale register value. In step 65, the gain slope factor generated in step 63 is multiplied by the offset corrected digital signal, completing calibration. The unipolar mode branch comprises steps 64 and 68 that are similar to steps 63, 65 except, by definition, only the positive gain slope factor will be generated.

Equation 1 mathematically describes the bipolar three point calibration operation.

$$D_{out} = slope(V_{IN} - Offset), \text{ where Offset is contents of the OCR 22} \quad \text{Eqn. 1}$$

Slope varies with the mode of operation and the polarity of the input signal. In bipolar mode there is a first slope $S_1$ for positive input signals and $S_1$ is one half the resolution of the converter 10 divided by the PFSCR 24 value. A second slope $S_2$ for negative input signals is one half the resolution of the converter 10 divided by the NFSCR 28 value. In unipolar mode, there is a third slope $S_3$ that is the full resolution of the converter 10 divided by the value in the PFSCR 24.

During zero scale calibration, the zero scale point is presented to the modulator 12. After the filter 14 has settled the offset register 22 is updated with the filter 14 value. This value is subtracted from every conversion thereafter. Offset calibration is identical for bipolar or unipolar modes.

The gain calibration function comprises four functional blocks. They are the full scale calibration registers (PFSCR 24, NFSCR 26), the multiply logic 20, and divide logic 30. During positive full scale calibration, the positive full scale reference voltage $V_{H(+)}$ is presented to the analog modulator 12. After the filter 14 has settled, the PFSCR 24 is updated with offset corrected data for $V_{H(+)}$. During negative full scale calibration, the negative full scale reference voltage $V_{L(-)}$ is presented to the analog modulator. After the filter 14 has settled the NFSCR 26 is updated with offset corrected data for $V_{L(-)}$. The values in registers 24, 20 are used to calculate the proper gain slope factor for each conversion result.

The ADC 10 determines which gain slope factor to use for each valid conversion. If the offset corrected data output from the summing node 18 is negative, the NFSCR 26 value is used to determine the gain slope factor. If the offset corrected data is positive, the PFSCR 24 value is used to determine the gain slope factor.

To minimize registers the proper gain slope factor is not permanently stored but is generated for each conversion. That is, after receiving offset calibrated data for non calibration conversion, the controller 16 selects the proper calibration register and completes the division routine that calculates the gain slope factor. After determining the gain slope factor, the multiplication of the offset corrected data by that gain slope factor occurs, completing calibration.

Gain calibration requirements are different for bipolar versus unipolar mode. In unipolar mode the calibration logic determines the slope factor by dividing the total resolution of the converter ($2^n$, where n is the number of bits in the output of the signal $D_{OUT}$) by the span between the zero and positive full scale points. In bipolar mode the gain factor is determined by dividing one half the total resolution ($2^{n-1}$) of the converter by the span between the zero and positive or negative full scale points. In either unipolar or bipolar mode this division result is multiplied by the offset corrected filter output to calculate the proper binary output for the ADC 10.

Division logic is used to calculate the gain factor discussed above. The divider 30 is activated after each valid conversion has completed. A valid conversion is defined as having removed offset error from digital filter 14 output for any non-calibration conversion. The result of the division is stored in a bidirectional shift register 46 used during the multiplication sequence.

The numerator N of divider 30 for all divides in bipolar mode is fixed and is $2^{n-1}$. The denominator D is either the PFSCR 24 value or the two's complement of the NFSCR 26. The two's complement of the NFSCR 26 represents the absolute value of the NFSCR 26 and is required as the division algorithm requires unsigned numbers.

For example, consider a 24 bit ADC 10 operating in its bipolar mode. The quotient of divider 30 is stored in register 46 as a binary number with three bits left of the binary point and 25 bits to the right of the binary point. The latter selection of the binary point can be varied, and is given only as a representative example of one embodiment. In unipolar mode, the division control logic in controller 16 is altered to multiply the final division result by two. This is required since $2^{24}$ cannot be represented in 24 bits. Using $2^{24}=2\times 2^{23}$, it is valid to multiply the division result (in unipolar mode) by two. As in bipolar mode, the quotient is stored as a binary number with three bits left of the binary point and 25 bits to the right of the binary point, its just that the answer is two times what one would expect given the raw data.

The division function described above assumes unsigned numbers and as implemented in divider 30 is a shift-subtract algorithm similar to shift-add multiplication. The division result is generated by comparing the divisor to the current remainder. If the divisor is less than or equal to the current remainder, the result is one and the divisor is subtracted from the current remainder. The new remainder is that subtraction result shifted left and appended with the next numerator bit. If the divisor is greater than the remainder, the result is zero and zero is subtracted from the current remainder. The new remainder is that subtraction result shifted left and appended with the next numerator bit.

The quotient is stored as a binary number with three bits left of the binary point and 25 bits to the right of the binary point in register 46. In unipolar mode, the quotient is $2\times 2^{23}$/PFSCR. In bipolar mode, the quotient is 2 exp23/FSCR, where FSCR can be either PFCSR or NFSCR.

As previously mentioned, the offset corrected data from the filter 14 is multiplied by the slope factor to complete calibration of the output. The multiplier 20 of the ADC 10 performs a serial shift-add multiply.

Generating the positive and negative calibration coefficients from the positive full scale voltage:

Having thus described one embodiment of the invention, those skilled in the art will appreciate that further changes, modifications, additions, and alterations may be made to the described embodiment without departing from the spirit and scope of the invention as set forth in the following claims. For example, one change would perform a multiplication operation followed by a division operation to replace the step of forming the gain correction factor. So, each time a non-calibration conversion was made the offset corrected signal would be multiplied by the resolution value and then divided by the suitable full scale register.

What we claim is:

1. A method for three point calibration of an analog to digital converter with a Sigma Delta modulator with n bit resolution comprising the steps of:

applying an input offset reference signal to the Sigma Delta modulator to generate a digital offset correction signal;

storing the digital offset correction digital output in an offset correction register;

applying a positive full scale signal to the Sigma Delta modulator;

storing the digital output in a positive full scale correction register;

applying a negative full scale signal to the Sigma Delta modulator;

storing the digital output in a negative full scale correction register.

2. The method of claim 1 further comprising the steps of:

setting a desired full scale value to half the resolution of the ADC;

dividing the desired full scale value by the value stored in the positive full scale correction register to derive a positive slope correction factor;

storing the positive slope correction factor;

dividing the desired full scale value by the value stored in the negative full scale correction register to derive a negative slope correction factor; and storing the negative slope correction factor.

3. The method of claim 2 further comprising the steps of:

applying an analog signal to the Sigma Delta modulator to generate an uncorrected digital output signal;

reducing the magnitude of the uncorrected digital signal by the magnitude of the offset correction register to derive an offset corrected signal;

sensing the polarity of the offset corrected signal to determine if the offset corrected signal is positive or negative;

multiplying a positive offset corrected signal by the positive slope correction factor and multiplying a negative offset corrected signal by the negative slope correction factor.

4. The method of claim 1 further comprising the steps of:

applying an analog signal to the Sigma Delta modulator to generate an uncorrected digital output signal;

reducing the magnitude of the uncorrected digital signal by the magnitude of the offset correction register to derive an offset corrected signal;

sensing the polarity of the offset corrected signal to determine if the offset corrected signal is positive or negative;

multiplying the offset corrected signal by a maximum of half the resolution of the ADC;

dividing the offset corrected signal by the digital value stored in the positive full scale correction register when the polarity of the offset corrected signal is positive; and dividing the offset corrected signal by the digital value stored in the negative full scale correction register when the polarity of the offset corrected signal is negative.

5. A Sigma Delta ADC with n bit resolution and three point calibration comprising:

an analog modulator;

means for applying an input offset reference signal to the Sigma Delta analog modulator to generate a digital offset correction signal;

an offset correction register for storing the digital offset correction signal;

means for applying a positive full scale signal to the Sigma Delta analog modulator to generate a positive full scale digital signal;

a positive full scale correction register for storing the positive full scale digital signal;

means for applying a negative full scale signal to the Sigma Delta analog modulator to generate a negative full scale digital signal; and a negative full scale correction register for storing the negative full scale digital signal.

6. The Sigma Delta ADC of claim 5 further comprising:

a desired full scale value set to half the resolution of the ADC;

means for dividing a maximum value of the desired full scale value by the digital signal stored in the positive full scale correction register to derive a positive slope correction factor;

means for dividing a maximum value of the desired full scale value by the value stored in the negative full scale correction register to derive a negative slope correction factor;

a correction factor register for storing the positive and the negative slope correction factors.

7. The Sigma Delta ADC of claim 6 further comprising:

means for applying an analog signal to the Sigma Delta analog modulator to generate an uncorrected digital output signal;

means for reducing the magnitude of the uncorrected digital signal by the magnitude of the offset correction register to derive an offset corrected signal;

means for sensing the polarity of the offset corrected signal to determine if the offset corrected signal is positive or negative;

means for multiplying a positive offset corrected signal by the positive slope correction factor and multiplying a negative offset corrected signal by the negative slope correction factor.

8. The Sigma Delta ADC of claim 5 further comprising:

a polarized reference voltage source of one polarity for generating one of said positive or negative full scale signals and zero reference voltage source.

9. The Sigma Delta ADC of claim 8 further comprising:

a differential input to the ADC having positive and negative input terminals, means, for coupling the polarized reference voltage source to one input terminal and the ground reference voltage source to the other terminal to generate a first full scale input signal of one polarity;

and means for reversing the couplings of the reference voltage sources to the differential inputs to generate a second full scale input signal of an opposite polarity.

10. The Sigma Delta ADC of claim 5 further comprising:

means for applying an analog signal to the Sigma Delta modulator to generate an uncorrected digital output signal;

means for reducing the magnitude of the uncorrected digital signal by the magnitude of the offset correction register to derive an offset corrected signal;

means for sensing the polarity of the offset corrected signal to determine whether the offset corrected signal is positive or negative;

means for multiplying the offset corrected signal by the maximum value stored of the desired full scale value;

means for dividing the offset corrected signal by the digital value stored in the positive full scale correction register when the polarity of the offset corrected signal is positive; and means for dividing the offset corrected signal by the digital value stored in the negative full scale correction register when the polarity of the offset corrected signal is negative.

11. A piece wise linear gain corrected ADC with an analog modulator, a digital filter having an input coupled to the output of the analog modulator and generating a filtered output comprising:

offset correction means for correcting offset of the filtered output of the converter to generate offset corrected signal;

first gain correction means having a first correction slope for gain correcting offset corrected signals over a first range;

second gain correction means having a second correction slope different from said first correction slope for gain correcting offset corrected signals over a second range.

* * * * *